US008540542B2

(12) United States Patent
Geohegan et al.

(10) Patent No.: US 8,540,542 B2
(45) Date of Patent: Sep. 24, 2013

(54) TRANSPARENT CONDUCTIVE NANO-COMPOSITES

(75) Inventors: David Bruce Geohegan, Knoxville, TN (US); Ilia N. Ivanov, Knoxville, TN (US); Alexander A. Puretzky, Knoxville, TN (US); Stephen Jesse, Knoxville, TN (US); Bin Hu, Knoxville, TN (US); Matthew Garrett, Sandston, VA (US); Bin Zhao, Easley, SC (US)

(73) Assignees: UT-Battelle, LLC, Oak Ridge, TN (US); University of Tennessee Research Foundation, Knoxville, TN (US)

( * ) Notice: Subject to any disclaimer, the term of this patent is extended or adjusted under 35 U.S.C. 154(b) by 95 days.

(21) Appl. No.: 13/083,122

(22) Filed: Apr. 8, 2011

(65) Prior Publication Data

US 2011/0212554 A1    Sep. 1, 2011

Related U.S. Application Data

(62) Division of application No. 11/965,651, filed on Dec. 27, 2007, now Pat. No. 7,923,922.

(60) Provisional application No. 60/877,602, filed on Dec. 27, 2006, provisional application No. 60/905,974, filed on Mar. 8, 2007.

(51) Int. Cl.
| *H01J 9/00* | (2006.01) |
| *B82Y 40/00* | (2011.01) |
| *B82Y 99/00* | (2011.01) |

(52) U.S. Cl.
USPC ............ 445/23; 977/932; 977/843; 977/750; 438/24; 264/482

(58) Field of Classification Search
None
See application file for complete search history.

(56) References Cited

U.S. PATENT DOCUMENTS

| 6,504,292 | B1 | 1/2003 | Choi et al. | |
| 6,923,946 | B2 | 8/2005 | Geohegan et al. | |
| 7,009,201 | B2 | 3/2006 | Kornilovich et al. | |
| 7,645,934 | B1 * | 1/2010 | Fidanza et al. | 136/263 |
| 7,960,037 | B2 * | 6/2011 | Liu et al. | 428/690 |
| 8,208,136 | B2 * | 6/2012 | Ivanov et al. | 356/301 |
| 2005/0208328 | A1 | 9/2005 | Hsu et al. | |
| 2006/0076557 | A1 | 4/2006 | Waller et al. | |

(Continued)

OTHER PUBLICATIONS

Neda, Z., and Florian, R., (1999), "Reconsideration of continuum percolation of isotropically oriented sticks in three dimensions", Physical Review E, vol. 59, No. 3.

(Continued)

*Primary Examiner* — Ashok Patel
(74) *Attorney, Agent, or Firm* — Scully, Scott, Murphy & Presser, P.C.

(57) ABSTRACT

The present invention, in one embodiment, provides a method of forming an organic electric device that includes providing a plurality of carbon nanostructures; and dispersing the plurality of carbon nanostructures in a polymeric matrix to provide a polymeric composite, wherein when the plurality of carbon nanostructures are present at a first concentration an interface of the plurality of carbon nanostructures and the polymeric matrix is characterized by charge transport when an external energy is applied, and when the plurality of carbon nanostructures are present at a second concentration the interface of the plurality of carbon nanostructures and the polymeric matrix are characterized by exciton dissociation when an external energy is applied, wherein the first concentration is less than the second concentration.

8 Claims, 8 Drawing Sheets

(56) References Cited

U.S. PATENT DOCUMENTS

| | | |
|---|---|---|
| 2006/0092370 A1 | 5/2006 | Lu |
| 2006/0118768 A1 | 6/2006 | Liu et al. |
| 2006/0279191 A1 | 12/2006 | Geohegan et al. |
| 2011/0281070 A1* | 11/2011 | Mittal et al. .................. 428/142 |

OTHER PUBLICATIONS

Schittenhelm, H., Geohegan, D.B., and Jellison, G.E. (2002), Synthesis and characterization of single-wall carbon nanotube-amorphous diamond thin-film composites.

Meyyappan, M. (Ed.), Carbon Nanotubes: Science and Applications. CRC Press, 2005, ISBM 0-8493-2111-5, pp. 167, 168, 259, 261.

Xu et al., Carbon nanotube effects on electroluminescence and photovoltaic response in conjugated polymers. Applied Physics Letters, vol. 87, Iss. 26, id. 263118 2005 (abstract).

Cassell et al., Large scale CVD synthesis of single-walled carbon nanotubes, J. Phys. Chem. B 1999 pp. 6484-6492.

Rinzler et al., Large-scale purification of single-walled carbon nanotubes; process, product and characterization. Appld. Phys. A 67 1998, pp. 29-37.

Dror et al, Carbon Nanotubes Embedded in Oriented Polymer Nanofibers by Electrospinning Langmuir, 2003, pp. 7012-7020.

\* cited by examiner

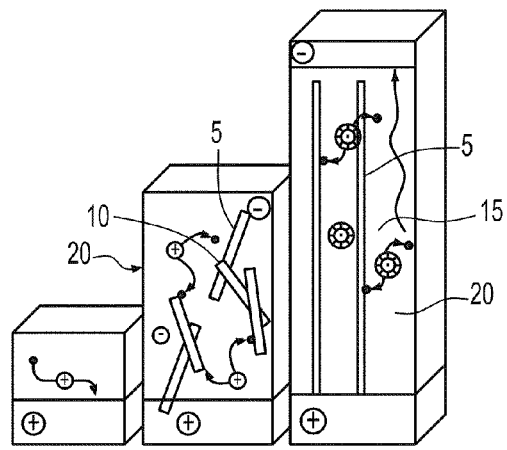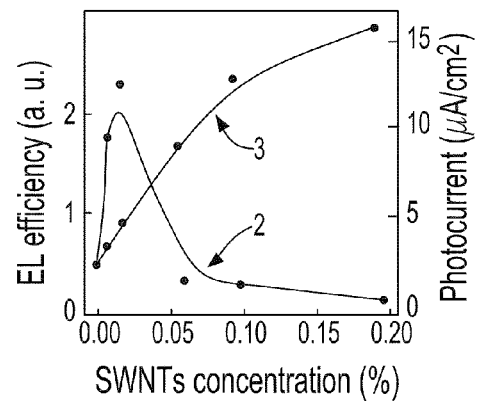
FIG. 1A  FIG. 1B
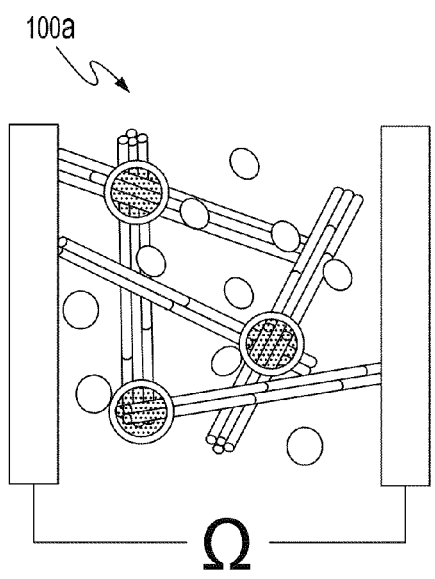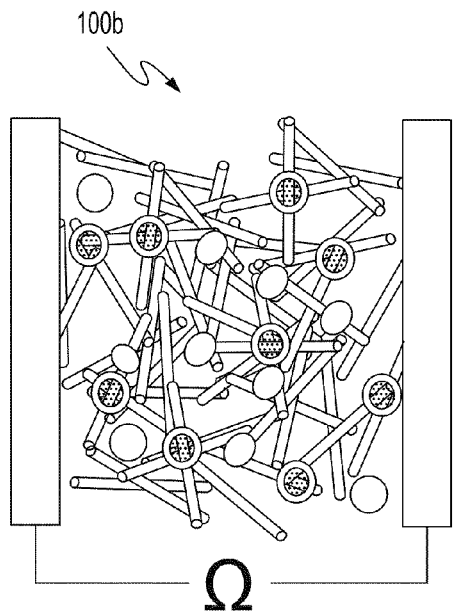
FIG. 2A  FIG. 2B

FIG. 9
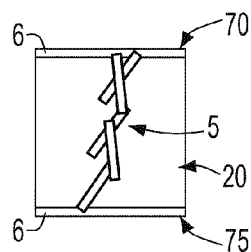
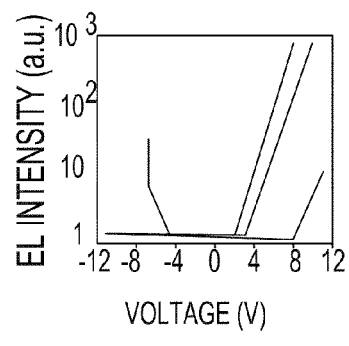
FIG. 10A
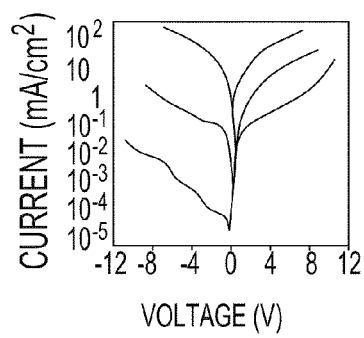
FIG. 10B
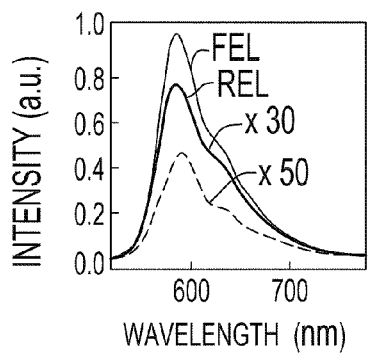
FIG. 10C
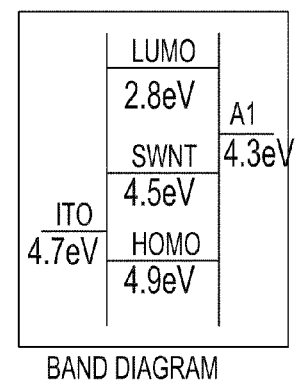
FIG. 10D

TRANSPARENT CONDUCTIVE NANO-COMPOSITES

CROSS REFERENCE TO RELATED APPLICATION

This application is a divisional of co-pending application Ser. No. 11/965,651 filed Dec. 27, 2007 and claims priority to U.S. provisional application Ser. No. 60/877,602, entitled "Transparent Conductive Nanorod Composite", filed on Dec. 27, 2006, and U.S. provisional application Ser. No. 60/905,974, entitled "Towards an Optimal Nanotube Dispersion for Transparent Conductive Coatings", filed on Mar. 8, 2007, and are hereby incorporated by reference.

STATEMENT REGARDING FEDERALLY SPONSORED RESEARCH

This invention was made with government support under Contract Number DE-AC05-00OR22725 awarded by the United States Department of Energy and UT-Battelle, LLC. The U.S. government has certain rights in this invention.

FIELD OF THE INVENTION

The present invention in one embodiment relates to composites composed of nanoscale materials, methods of forming composites of nanoscale materials, and applications for nanoscale materials.

BACKGROUND OF THE INVENTION

Transparent conducting coatings are of commercial use in display technologies, optics, electromagnetic shielding and many other applications. Indium Tin Oxide (ITO) is the most widely used coating, however it is inflexible and requires high processing temperatures to fabricate.

Efficient thin film devices, including organic photovoltaic and organic electroluminescent devices have been the subject of much advancement. In particular, organic light emitting materials have attracted increasing interest in the past two decades. Organic light emitting diodes (OLEDs) may be either small molecule OLED or polymer OLED. Soluble light emitting polymers are appealing for manufacture of large area, low cost light emitting devices. In recent years, screen and inkjet printing have been successfully applied to this area, promising lower cost for area lighting, patterning and display applications.

While the emissive electroluminescent layer is polymeric, varying amounts of OLEDs can be deposited in arrays on a screen using simple "printing" methods to create a graphical color display, for use as television screens, computer displays, advertising and information board applications, and the like. OLED may also be used in lighting devices. Prior to standardization, OLED technology was also referred to as organic electro-luminescence.

SUMMARY OF THE INVENTION

In one embodiment, the present invention provides a polymer composite including nanoscale materials and methods for forming a polymer composite including nanoscale materials. In one embodiment, the polymer composites composed of nanoscale materials that are provided by the present invention are characterized as having optimized transparency and electrical conductivity.

In one embodiment, the present invention provides a method of forming an organic electric device including: providing a plurality of conductive nanostructures; and dispersing the plurality of conductive nanostructures in a polymeric matrix to provide a polymeric composite, wherein when the plurality of conductive nanostructures are present at a first concentration the organic electric device is characterized by an electroluminescent response, and when the plurality of conductive nanostructures are present at a second concentration the organic electric device is characterized by a photovoltaic response, wherein the first concentration is less than the second concentration.

In one embodiment, the first concentration of the plurality of conductive nanostructures provides an organic light emitting diode, and wherein the second concentration of the conductive nanostructures provides a photovoltaic device. In one embodiment, the first concentration ranges from about 0.001 wt. % to about 0.2 wt. % and the second concentration ranges from about 0.001 wt. % to about 1.0 wt. %.

In one embodiment, the conductive nanostructures are single wall carbon nanotubes (SWNTs) that are provided by laser vaporization, treated with an acid treatment, and oxidized to high purity. In one embodiment, high purity carbon nanotubes are composed of greater than about 90% carbon. In another embodiment, the conductive nanostructures are vertically aligned carbon nanotubes. In one embodiment, the vertically aligned carbon nanotubes are grown by chemical vapor deposition.

In one embodiment, the conductive nanostructures are doped to provide a work function positioned between a highest occupied molecular orbital and a lowest occupied molecular orbital of the polymer matrix.

In one embodiment, the step of dispersing the plurality of conductive nanostructures in a polymeric matrix includes at least one of dielectrophoretic alignment, vacuum filtration, electrospun nanotube-polymer fibers, spray deposition of solublized nanotubes, or a combination thereof. In one embodiment, the step of dispersing the plurality of conductive nanostructure in polymeric matrix includes a solvent, wherein the solvent includes ortho-dichloro benzene (ODCB), chloroform ($CHCl_3$), sodium dodecyl sulfate (SDS), sodium colate (SC), sodium dodecyl benzene sulphonate (SDBS), t-octyl phenoxy polyethoxyethanol (Triton X-100), or combinations thereof. In one embodiment, the step of dispersing the plurality of conductive nanostructures in the polymer matrix includes adding salts and dopant materials to the solvent, wherein the salts and the dopant materials reduce a resistance at a junction of the conductive nanostructures and the polymer matrix.

In another aspect, the present invention provides an organic electrical device that may include a polymer composite. In one embodiment, the present invention provides an organic electrical device including:
a polymer composite including a first plurality of conductive nanostructures; and
a positive electrode and a negative electrode on opposing sides of the polymer composite, wherein at least one of the positive electrode and the negative electrode includes a second plurality of conductive nanostructures.

In one embodiment, the second plurality of conductive nanostructures includes a dopant to provide at least one of the positive electrode and the negative electrode with a work function that substantially matches a work function of the polymer composite. In one embodiment, the positive electrode and/or the negative electrode that is not composed of the second plurality of conductive nanostructures is composed of a metal.

In one embodiment, the organic electrical device is a organic light emitting diode when the first plurality of conductive nanostructures has a concentration of a first value, and the organic electrical device is a photovoltaic device when the first plurality of conductive nanostructures has a concentration of a second value, wherein the first value is less than the second value. In one embodiment, the first value is a first concentration ranging from about 0.001 wt. % to about 0.2 wt. %, and the second value is a second concentration ranging from about 0.001 wt. % to about 1.0 wt. %.

In one embodiment, the polymer composite is composed of a polymer matrix and the plurality of conductive nanostructures includes single wall carbon nanotubes positioned within the polymer matrix, wherein the single wall carbon nanotubes provide electrical communication between the positive electrode and the negative electrode and are positioned at less than a percolation threshold. In one embodiment, the polymer composite includes a conjugated polymer poly(2-methoxy-5-(2'-ethylhexyloxy)-1,4-phenylenevinylene) (MEHPPV). Other polymers include electroluminescent polymers such as polythiophenes.

In one embodiment, the first plurality of conductive nanostructures of the organic electrical device are n-type or p-type doped. In one embodiment, the dopant may be composed of thionyl chloride ($SOCl_2$), triethylamine ($Et_3N$), pyridine ($C_6H_5N$), and/or orthodichlorobenzene. In one embodiment, the first plurality of conductive nanostructures are vertically aligned carbon nanotubes.

In one embodiment, the thickness of the organic electrical device includes a thickness of up to 100 microns.

In one embodiment, when operating in a reverse bias condition, the organic light emitting diode produces an emission of light.

In another embodiment, the present invention provides an organic electrical device. In one embodiment, the organic electric device includes:

a positive electrode and a negative electrode; and a polymer composite positioned in electrical contact to the positive electrode and the negative electrode, the polymer composite including a polymer matrix and a minimum percolation network of conductive nanostructures that provides electrical communication between the positive electrode and the negative electrode through the polymer matrix.

In another embodiment, the present invention provides a method for forming a nanostructure polymer composite material. In one embodiment, the method includes the steps of:

providing a polymer matrix providing a bundle of carbon nanotubes within the polymer matrix; and dispersing the bundle of carbon nanotubes to a network of carbon nanotubes, wherein a work function of dispersed carbon nanotubes substantially matches a work function of the polymer matrix.

In one embodiment, nanotubes may be deposited or aligned on a substrate followed by deposition of the polymer by spin-coating, spray, laser transfer or a combination thereof. In one embodiment, nanotubes and polymer may be co-dispersed and then co-deposited. In another embodiment, the polymer, or monomer of a polymer, may be applied first, followed by nanotube deposition, and then in-situ polymerization.

In one embodiment, the step of providing the bundle of carbon nanotubes includes laser vaporization. In one embodiment, the step of dispersing the bundle of carbon nanotubes includes a solvents that reduces the bundle size of the carbon nanotubes. In one embodiment, the solvent includes, but is not limited to: sodium dodecyl sulfate (SDS), sodium cholate (SC), sodium dodecyl benzene sulphonate (SDBS), t-octyl phenoxy polyethoxyethanol (Triton X-100), or a combination thereof. In one embodiment, prior to dispersion the bundle of carbon nanotubes has a diameter of greater than 50 nm. In one embodiment, after dispersion the diameter of the bundle of carbon nanotubes is less than 50 nm.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1A pictorially depicts a network of carbon nanotubes, through a polymer matrix of an organic electronic device, and an aligned network of carbon nanotubes through a polymer matrix of an organic electronic device, in accordance with the present invention.

FIG. 1B is a plot depicting the effect of nanotube concentration on the photovoltaic or electroluminescent response of a polymer composite, in accordance with one embodiment of the present invention.

FIG. 2A is a perspective side view of one embodiment of a nanotube bundle, in accordance with the present invention.

FIG. 2B is a perspective view of one embodiment of a network of dispersed carbon nanotubes, in accordance with one embodiment of the present invention.

FIG. 9 is a top view depicting one embodiment of dielectrophoretic alignment, in accordance with the present invention.

FIG. 10A is a plot of voltage v. EL intensity for one embodiment of an organic electrical device, in accordance with the present invention.

FIG. 10B is a plot of voltage v. current for one embodiment of an organic electrical device, in accordance with the present invention.

FIG. 10C is a plot of wavelength v. intensity for one embodiment of an organic electrical device, in accordance with the present invention.

FIG. 10D is a pictorial representation of a band gap diagram.

DETAILED DESCRIPTION OF THE INVENTION

Figure 3:
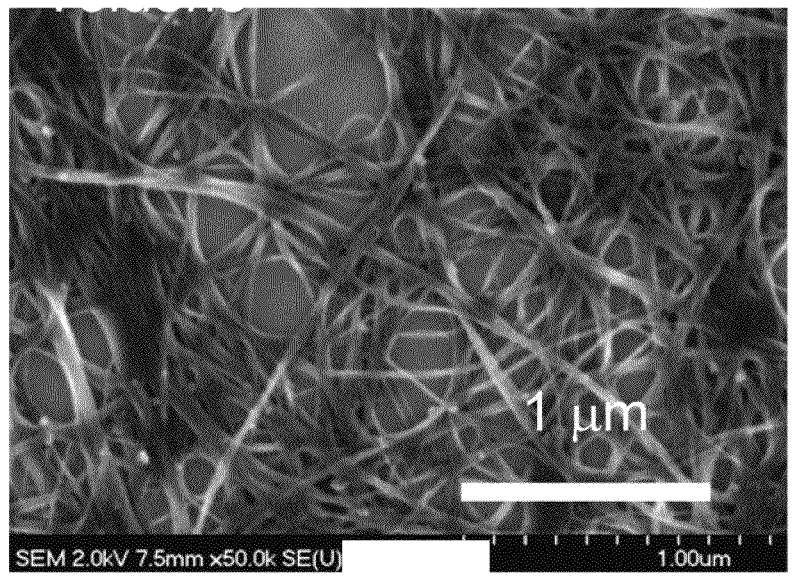
FIG. 3 is a micrograph depicting one embodiment of a network of carbon nanotubes, in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel structures for organic electrical devices and methods of forming organic electrical devices, e.g., organic light emitting diodes (OLED) and organic photovoltaic devices. When describing the inventive structures and methods, the following terms have the following meanings, unless otherwise indicated.

An "electroluminescent response" is where a material emits light in response to an electric current passed through it, and/or to the application of an electric field.

"Photovoltaic response" is where a material produces electrical energy in response to the application of light.

A "composite" is a material composed of two or more constituents with different physical and/or chemical properties in which the chemical and/or physical properties of the two or more constituents remain distinct in the material.

An "organic light emitting diode" is a diode having an electroluminescent layer composed of an organic material. In one embodiment, the organic material is a polymer.

As used herein "nanostructures" is an object of having at least one dimension between molecular and microscopic (micrometer-sized) dimension, and having an aspect ratio of length to width greater than 10.

"Nanotube" as used herein is meant to include single wall and multi-wall nanotubes unless specifically specified as distinct. In one embodiment, a carbon nano-tube is at least one graphene layer wrapped into a cylinder. In one embodiment, a single wall carbon nano-tube is a graphene rolled up into a seamless cylinder with diameter of the order of a nanometer. A multi-wall carbon nano-tube is a plurality of graphene sheets rolled up into a seamless cylinder with diameter of the order of a nanometer.

A "network" as used in conjunction with nanostructures means an electrically conductive pathway through the polymer matrix that is composed of at least two nanostructures that are engaged in electrical communication.

As used herein, "P-type" refers to the addition of impurities to an intrinsic carbon nanostructures that creates deficiencies of valence electrons.

As used herein, "N-type" refers to the addition of impurities that contribute free electrons to an intrinsic carbon nanostructures.

As used herein, "the work function" is the minimum energy (measured in electron volts) needed to remove an electron from a solid to a point immediately outside the solid surface (or energy needed to move an electron from the Fermi energy level into vacuum).

"Electrically conductive", "electrical communication", and/or "electrically communicating" as used through the present disclosure means a material having a room temperature conductivity of greater than $10^{-8}$ $(\Omega\text{-m})^{-1}$.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", "beneath", "underlying", "below", "overlying" and derivatives thereof shall relate to the invention, as it is oriented in the drawing figures.

In one embodiment, the present invention relates to methods for forming transparent conductive composites. In one embodiment, an organic electrical device is provided having a polymer conductive nanostructure composite that displays electroluminescent properties, hence being suitable for organic light emitting diode (OLED) device applications, or displays photovoltaic properties, hence being suitable for organic photovoltaic (PV) devices, in which the concentration of conductive nanostructures present in the polymer matrix of the polymer conductive nanostructure composite dictates whether the organic electrical device displays electroluminescent properties or photovoltaic properties.

In one embodiment, organic photovoltaic devices or organic light emitting devices are composed of a polymer matrix and a network of conductive nanostructures having high aspect ratios, i.e., ratio of length to diameter, which include, but at not limited to: nanoribbons, such as carbon or ZnO nanoribbons; nanorods, such as ZnO nanorods doped with F, N, or $In_2O_3$ nanorods doped with Sn; or nanocylinders, such as single walled nanotubes, double wall nanotubes, few wall nanotubes, or multi-wall nanotubes. In one embodiment, the material of the nanostructures could be carbon and/or a metal oxide that is doped to increase conductivity, for example doped with small molecules or metal ions. Although, carbon nanotubes are discussed from this point forward, it is noted that the present invention is equally applicable to other conductive nanostructures and geometries.

It is further noted that the polymer matrix may be composed of any polymer material that emits light in response to an electric current or an electric field, examples of which include, but are not limited to: poly(phenylene vinylene), polythiophenes, polypyridines, poly(pyridyl vinylenes), polyphenylenes and copolymers of these materials. In one embodiment, the polymer is a conjugated polymer. Conjugated polymers have a framework of alternating single and double carbon-carbon and/or carbon-nitrogen bonds or carbon-sulfur bonds. Single bonds are referred to as σ-bonds, and double bonds contain a σ-bond and a π-bond. Conjugated polymers have a σ-bond backbone of overlapping $sp^2$ hybrid orbitals. The remaining out-of-plane $p_z$ orbitals on the carbon (or nitrogen) atoms overlap with neighboring $p_z$ orbitals to give π-bonds.

In one embodiment, the incorporation of carbon nanotubes into the polymer matrix improves the light-emitting (electroluminescence) and photovoltaic response of composite polymers by facilitating charge injection and dissociating excitons, respectively. In one embodiment, carbon nanotubes are either present in a network of carbon nanotube or are present in a vertically aligned array to allow for greater volumes of polymers to be accessed for more efficient electroluminescence or photovoltaic operation. Polymers and networks of carbon nanotubes when combined create interfaces of nanometer dimensions, which permit efficient charge separation or injection along the high surface area networks for increased efficiency of electroluminescence or photovoltaic operation as compared to either component by itself.

FIG. 1A pictorially depicts a network 10 of carbon nanotubes 5 through a polymer matrix 20 of an organic electrical device; a vertically aligned array 15 of carbon nanotubes 5 through a polymer matrix 20 of an organic electronic device, in comparison to an organic electric device that does not include carbon nanotubes 5. In one embodiment, the thickness of the electronic organic device may be increased by the incorporation of the carbon nanotubes 5, yet the electrical communication through the organic electronic device is increased, as is the electroluminescence of the device. The thickness of the electronic device may be increased, because the network 10 of carbon nanotubes 5, or the aligned array 15 of carbon nanotubes, provides an electrically conductive pathway from the first electrode to the second electrode through the more resistive polymer matrix. In one embodiment, by providing the conductive network the distance separating the opposing electrodes may be increased, which allows for a greater volume of the polymer matrix to be positioned between the electrodes. In one embodiment, an organic electrical device is provided that provides increased electroluminescence, because there is a greater volume of the light emitting polymer matrix 20 between the electrodes, and because the network 10 of carbon nanotubes 5, or aligned array 15 of carbon nanotubes 5, allows for efficient charge separation or injection from the carbon nanotubes 5 to the polymer matrix 20. In one embodiment, the thickness of the organic electrical device may be greater than 100 nm. In another embodiment, the thickness of the organic electrical device may be greater than 5 microns. In an even further embodiment, the thickness of the organic electrical device may be on the order of 100 microns.

In embodiments of the present invention in which the organic electrical device is configured to provide an organic light emitting diode (OLED), electrons and holes can be easily injected into carbon nanotubes due to the low work function of carbon nanotubes relative to that of the polymer matrix or the electrodes. In one embodiment, the work function of the carbon nanotubes may range from about 4.5 eV to about 3.2 eV. In one embodiment, the work function of the polymer may range from about 5.0 eV to about 6.0 eV.

In one embodiment, charge transport from the carbon nanotubes to the chains of the polymer matrix can occur at lower bias (lower turn on voltage) due to the smaller potential barriers between the nanotubes and polymer chains. In one embodiment, nanotube-facilitated charge injection may occur at both forward and reverse biases, leading to polymer electroluminescence. As a consequence, this cascade injection process can greatly enhance charge injection in organic light-emitting diodes. In one embodiment, the turn on voltage of an organic electric device in forward bias that is produced in accordance with the present invention may range from about 2 V to about 8 V. In another embodiment, the turn on voltage of an organic electric device that is produced in reverse bias in accordance with the present invention may range from about 6 V to about 16 V. Referring to FIG. 1B, in one embodiment the incorporation of carbon nanotubes to the polymer matrix increases electroluminescence 2 when present in a concentration greater than 0.0 wt % and less than 0.1 wt %.

In one embodiment, in which the organic electrical device is configured to provide an organic photovoltaic device, the use of carbon nanotubes can introduce donor-acceptor interactions between nanotubes and polymeric chains of the polymer matrix. In one embodiment, the donor-acceptor interaction can effectively dissociate the photoexcitation-generated excitons for the generation of charge carriers. At high concentrations nanotubes can contribute to the photocurrent of the system due to their light absorption and exciton generation capabilities. Additionally, the carbon nanotubes can also transport dissociated charge carriers for the generation of photocurrent. Referring to FIG. 1B, in one embodiment of the organic electrical device, the carbon nanotubes improve photovoltaic response, wherein as the concentration of the carbon nanotubes increases to approximately 0.20 wt % the photovoltaic response 3 increases.

In one embodiment, the present invention provides enhanced optimal electroluminescence in organic light emitting diodes (OLED) at nanotube concentrations at about the electrical conductivity percolation threshold. In one embodiment, the nanotube concentration is selected to provide that the electrons and holes recombine in the polymer matrix with the highest efficiency of light emission and with minimum losses to secondary processes, such as annihilation and nonradiative relaxation, exciton and charge carrier trapping at defect sites etc. In one embodiment, the nanotube concentration is the minimum percolation threshold that provides electrical communication through the polymer matrix between the positive electrode and the negative electrode of the organic electrical device.

Percolation threshold (PT) is defined as the minimum concentration of conducting material, i.e., carbon nanotubes, needed to assemble a conductive path through the polymer matrix of the polymer composite. In one embodiment, the percolation threshold is the minimum concentration of carbon nanotubes for which current begins to flow through an insulating matrix (in this case, a poorly "conducting" polymer). In one embodiment, above percolation threshold, the charge is carried principally by the carbon nanotubes. In one embodiment, just below percolation threshold, charge is carried into regions of the polymer matrix that is otherwise inaccessible due to the high resistance of the polymer matrix, wherein the charge conduction pathway includes both conduction through the polymer matrix, and charge conduction through the network of conducting carbon nanotubes.

In one embodiment, just below the percolation threshold represents the regime of maximal charge injection and interaction with the polymer matrix that provides the greatest electroluminescent response. In one embodiment, at higher nanotube concentrations (above the percolation threshold), the proximity of nanotubes within an exciton diffusion path length results in effective dissociation of excitons at the nanotube-polymer interface and charge collection, thereby competing with electroluminescence and enabling efficient photovoltaic operation.

In one embodiment, using the concept of excluded volume, in which the excluded volume is an effective volume that is occupied by an essentially 1-D or 2-D object, and considering the carbon nanotubes (CNTs) as rigid rods, and applying a definition of a two-dimensional percolation threshold, the percolation threshold concentration of SWNT ($q_p$), corresponding to the maximum efficiency of an organic light emitting diode is approximately equal to:

$$q_p = (N_c/V_p) \approx (1/V_{ex})$$

where $N_C$ is the number of carbon nanotubes at percolation and $V_p$ is the volume of the cube in which percolation problem is considered, i.e., the polymer composite volume, and $V_{ex}$ is the excluded volume.

Figure 13:
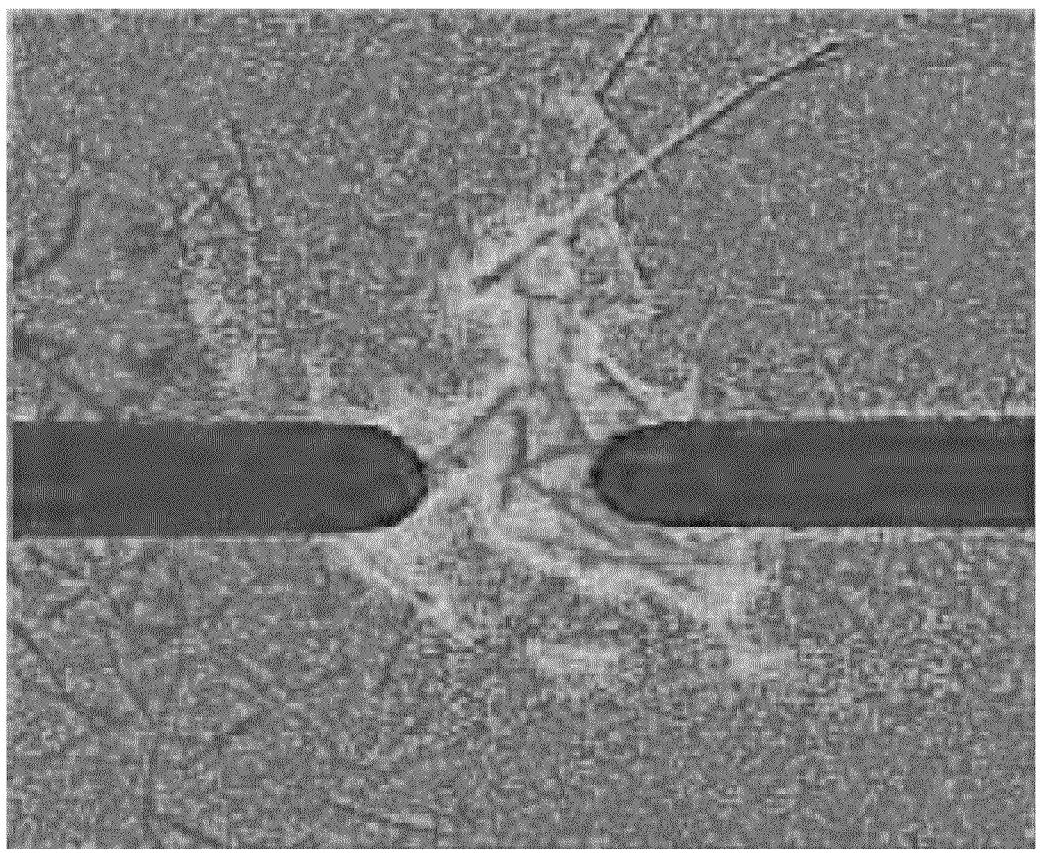
FIG. 13 depicts a micrograph of nanotubes embedded in a 20 nm thick polymer which are carrying current between two electrodes that are spaced approximately 2 microns apart, wherein current is carried across the gap between the electrodes by the percolated nanotube, in accordance with one embodiment of the present invention.

FIG. 13 depicts one example of a polymer nanostructure composite illustrating a number of carbon nanotubes at percolation ($N_c$), in accordance with the present invention. In this example, the polymer nanostructure composite is approximately 20 nm thick and includes a network of carbon nanorods that are embedded in a polymer matrix. The network of carbon nanorods extend between two separated and opposing electrodes, wherein current between the electrodes is carried across the approximately 2 micron gap that separates the opposing electrodes by the network of carbon nanorods.

In this example, the minimum number of nanorods that are necessary to provide a electrically conductive pathway, i.e., perculation pathway, from one electrode to the opposing electrode is equal to approximately 2 nanorods, wherein each nanorod has a length of approximately 1 micron. Still referring to FIG. 13, approximately 20 nanorods are charged by a current applied to the electrodes and form a percolation network. Roughly, in this example 2 nanorods (Nc) in a volume of approximately 0.02 cubic microns (Vp) yields a critical pathway for the approximately 1 micron-long nanorods.

In this example, the perculation threshold ($q_b$) is equal to 2 nanorods (Nc)/(0.02 cubic microns (Vp)) or 100/cubic micron. It is noted that the example described above with respect to FIG. 13 is provided for illustrative purposes only and that the present invention is not intended to be limited thereto, as other dimensions and nanotube concentrations have been contemplated.

In one embodiment, the excluded volume is equal to:

$$V_{ex}(d, l) = 2 \cdot d \cdot ((2\pi/3)d^2 + \pi \cdot d \cdot l + l^2 \cdot \langle \sin \gamma \rangle)$$

where d and l are the diameter and the length of a single nanotube (or nanotube bundle), $\gamma$ is the angle between possible orientation of two conducting carbon nanotubes of the network.

In one embodiment, the diameter (d) ranges from about 0.1 nm to about 1000 nm. In another embodiment, the diameter (d) ranges from about 1 nm to about 20 nm. In a further embodiment, the diameter (d) ranges from about 1.2 nm to about 5.0 nm. In a further embodiment, the diameter (d) ranges from about 1.0 nm to about 2.0 nm.

In one embodiment, the length (l) ranges from about 10 nm to about 1 cm. In another embodiment, the length (l) ranges from about 10 nm to about 10 mm. In a further embodiment, the length (l) ranges from about 10 nm to about 500 nm.

In one embodiment, the angle ($\gamma$) ranges from about 0° to about 180°. In another embodiment, the angle ($\gamma$) ranges from about 1° to about 45°. In a further embodiment, the angle ($\gamma$) ranges from about 2° to about 30°. In a further embodiment, the angle ($\gamma$) ranges from about 2° to about 15°. In one embodiment, for the isotropic case ($\langle \sin \gamma \rangle = \pi/4$).

In another embodiment, the continuum threshold may be determined using continuum percolation though isotropically-oriented sticks in three dimensions following Z. Neda, R. Florian, Y. Brechet Phys. Rev. E 59, 3 3717-3719 (1999).

In one embodiment when the carbon nanotubes are positioned in a network, the single wall carbon nanotubes are provided by laser vaporization. In one embodiment, the single wall carbon nanotubes are formed using laser vaporization in combination with a catalyst, such as a metal catalyst. In one embodiment, the catalyst is supported on a substrate, such as a graphite substrate, or the catalyst may be floating metal catalyst particles. In one embodiment, the metal catalyst may be composed of Fe, Ni, Co, Rh, Pa or alloys and combinations thereof.

In one embodiment, laser vaporization includes a laser beam that impinges on a carbon (also referred to as graphite) target, such as a volume of a carbon containing feedstock gas, e.g., methane or carbon monoxide. In one embodiment, the laser used to vaporize the carbon target is a pulsed or continuous laser, wherein the carbon target is present in an oven at a temperature on the order of about 1200° C. In one embodiment, a pulsed laser has a light intensity on the order of about 100 kW/cm$^2$, wherein a continuous laser has a light intensity on the order of about 12 kW/cm$^2$. In one embodiment, the oven is filled with helium or argon gas in order to keep the pressure at 500 Torr.

In one embodiment, vapor plumes foam, expand and cool. As the vaporized species cools, carbon molecules and atoms quickly condense to form larger clusters, which may include fullerenes. In one embodiment, the catalysts also begin to condense and attach to carbon clusters and prevent their closing into cage structures. Catalysts may open cage structures when they attach to them. In one embodiment, from these initial clusters, tubular molecules grow into single-wall carbon nanotubes until the catalyst particles become too large, or until conditions have cooled sufficiently that carbon no longer can diffuse through or over the surface of the catalyst particles. In one embodiment, the single-wall carbon nanotubes formed in this case are bundled together by van der waals forces to provide the network.

In one embodiment, the diameter of a single wall nanotube, as used in accordance with the present invention ranges from about 1 nanometers to about 20 nanometers. In another embodiment, the diameter of a single wall nanotube ranges from about 1.2 nanometers to about 1.4 nanometers. In one embodiment the length of a single wall nanotube, as used in accordance with the present invention ranges from about 0.5 nanometers to about 10 microns. In another embodiment, the length of a single wall nanotube ranges from about 100 nanometers to about 10 millimeters. In one embodiment, the nanotubes used in accordance with the present invention have an aspect ratio of length to width on the order of approximately 1,000:1.

In one embodiment, carbon nanotubes produced by laser ablation have a high purity. In one embodiment, the carbon nanotubes may have a high purity on the order of about 90% carbon or greater. In another embodiment, the carbon nanotubes may have a high purity on the order of about 95% to about 99% carbon. In an even further embodiment, the carbon nanotubes have a high purity on the order of about 99% or greater.

In an even further embodiment, the nanotubes comprise a majority of carbon. In one example, the nanotubes include a carbon content ranging from about 50% to about 70%. In another example, the carbon content ranges from about 70% to about 90% carbon. In another example, the carbon content is greater than 90% carbon.

In one embodiment, the carbon nanotubes may be further purified by a process that includes an acid treatment followed by an oxidation. In one embodiment, the acid treatment may include treatment and oxidation steps are provided by a dilute $HNO_3$ reflux/air oxidation procedure.

In one embodiment, the carbon nanotubes produced by laser vaporization are typically formed in bundles. Referring to FIGS. 2A and 2B, a bundle is a plurality of interconnected carbon nanotubes. In one embodiment, a bundle 100 of nanotubes 5 has a diameter on the order of about 50 nm or greater. In one embodiment, the present method provides relatively defect-free single wall nano tube (SWNT) which aggregate into bundles of carbon nanotubes that are subsequently processed and dispersed into a network characterized as just below the percolation threshold, which can provide the maximal charge injection and interaction with the polymer matrix of the polymer composite resulting in maximal electroluminescence.

In one embodiment, the nanotube bundles as being introduced to the polymer matrix do not disperse into individual nanotubes 5, but remain in bundles including several nanotubes up to hundreds of nanotubes, which form interconnected, complex, branched networks of indeterminate length.

In one embodiment, the reduction of percolation networks to the percolation threshold includes reducing the thickness of carbon nanotube network to a thin film, i.e., essentially two-dimensional networks. In one embodiment, the thin film of the carbon nanotube network has a thickness ranging from about 20 nm to about 100 nm for a single nanotube bundle. In one embodiment, through the restriction of essentially all of the nanotubes to a single plane, electrical conductivity is maximized for a given number of nanotubes per unit area, thereby satisfying the minimum optical absorption for providing a transparent conductive composite.

In a following process step, the carbon nanotubes may be doped to adjust the work function of the carbon nanotubes. In one embodiment, N-type and P-type doping of carbon nanotubes is desirable to tune the work function and electron-accepting ability of polymer carbon nanotube composites for optoelectronic applications. The carbon nanotubes may be doped to be P-type or N-type. P-type denotes that the nanotube includes an excess of holes, i.e., positive charge carriers, wherein the nanotube may be doped with dopants to provide the excess of holes. N-type denotes that the nanotube includes an excess of electrons, i.e., negative charge carriers, wherein the nanotube may be doped with dopants to provide an excess of electrons.

In one embodiment, the carbon nanotubes become P-type following growth once exposed to the ambient air, wherein oxygen molecules are absorbed onto the carbon nanotube surface and through surface interactions alter the nanotube's electrical state rendering the nanotubes P-type conductivity. In another embodiment, exposure of the nanotube to potassium atoms may result in absorption of the potassium to the carbon nanotube, which dopes that region of the nanotube N-type. In a further embodiment, exposure of the carbon nanotube to fluorinated carboxylic acids and sulfonic acids produces a P-type conductivity carbon nanotube.

In one embodiment, the work function of carbon nanotubes is located between the lowest unoccupied molecular orbital (LUMO), and the highest occupied molecular orbital (HOMO) of the organic semiconducting polymers. As a result, electrons and holes can be injected into the carbon nanotubes without any potential barrier provided that the interfacial distance between carbon nanotubes and polymer chains is sufficiently small enough and then the electrons and holes will be further injected into the polymer chains through much reduced potential barriers. This cascade charge injection may occur at both forward and reverse biases.

In one embodiment, doping of the carbon nanotubes can change two physical parameters: work function and electron accepting ability. In one embodiment, the change of work-function can tune the charge injection in organic light-emitting diodes (OLED). In another embodiment, the variation of electron accepting ability can modify the donor-acceptor interaction strength in polymer/nanotube composites, and therefore change exciton dissociation yields of photovoltaic devices, such as polymer solar cells.

In one embodiment, the doping of the carbon nanotubes affects the interaction between bundles of carbon nanotubes and the polymer matrix. In one embodiment, because dispersion of the carbon nanotubes is sensitive to charging, the present invention simultaneously dopes the nanotubes to alter their electrical properties to substantially match the electrical properties of the polymer, while aiding in the dispersion to provide better interfaces with the polymer matrix. In one embodiment, a bundle of nanotubes, as depicted in FIG. 2A, has the same number of nanotubes as a dispersions of nanotubes, as depicted in FIG. 2B, but the dispersion of nanotubes has a lower resistance and higher transmittance than the bundle of nanotubes. FIG. 3 depicts a micrograph of a dispersion of carbon nanotubes. In one example, a dispersion of nanotubes has a junction resistance ranging from about 0.1 M$\Omega$ to about 100 M$\Omega$. In one example, a dispersion of nanotubes has a tube resistance ranging from about 1.5 k$\Omega$ to about 250 k$\Omega$.

For example, doped single wall nanotubes (SWNTs) may debundle more effectively leading to much better dispersion, and thereby greatly altering the percolation network and the number of interfaces for charge injection or collection. In one embodiment, doping nanotubes essentially produces a charge on the nanotube. In one embodiment, charged nanotubes present in a suitable solvent facilitate debundling of carbon nanotube bundles by electrostatic repulsion.

Figure 4:
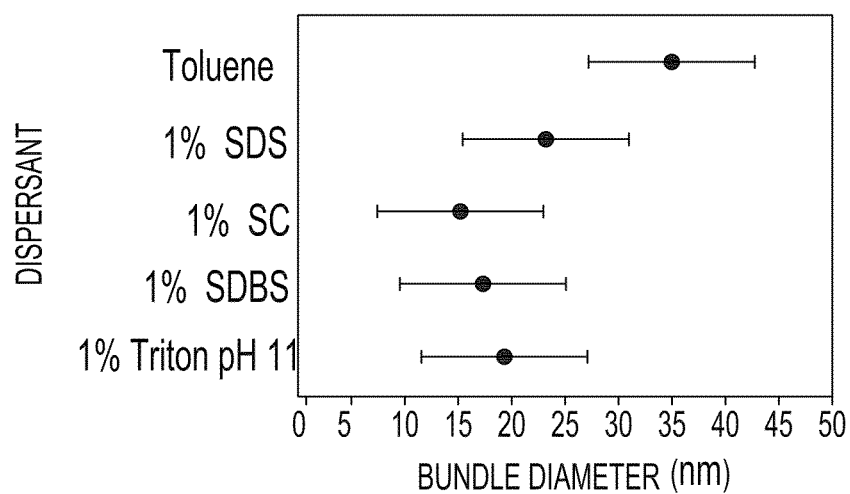
FIG. 4 is a plot depicting bundle diameter v. dispersant type, in accordance with one embodiment of the present invention.
Figure 5:
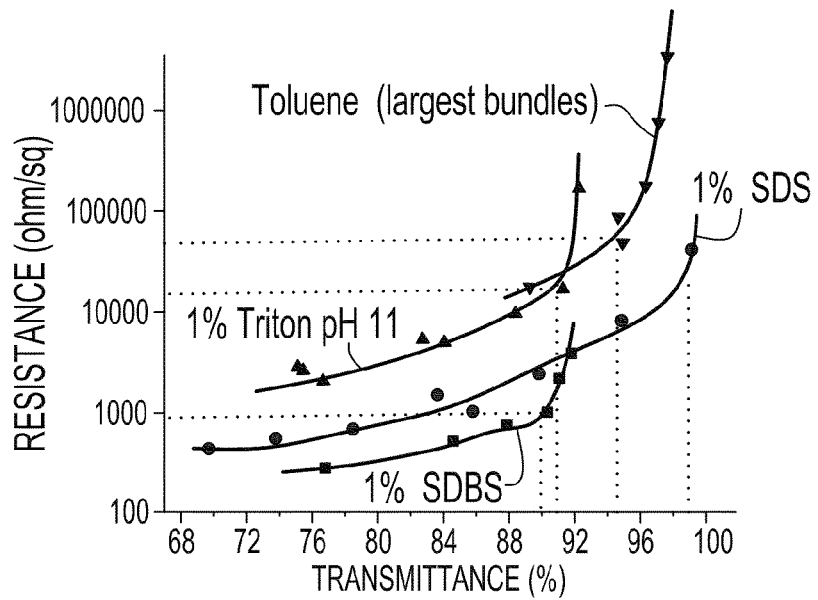
FIG. 5 is a plot depicting bundle size on resistance and transmittance of carbon nanotube, in accordance with one embodiment of the present invention.

In one embodiment, solvents that are suitable for reducing the bundle size of the carbon nanotubes include sodium dodecyl sulfate (SDS), sodium cholate (SC), sodium dodecyl benzene sulphonate (SDBS), t-octyl phenoxy polyethoxyethanol (Triton X-100), or a combination thereof. Referring to FIG. 4, in one embodiment, a bundle of carbon single wall nanotubes being dispersed in a solvent of sodium dodecyl sulfate (SDS) may have a reduced bundle diameter ranging from about 15 nm to about 35 nm. In another embodiment, a bundle of carbon nanotubes being dispersed in a solvent of sodium cholate (SC) may have a reduced bundle diameter ranging from about 5 nm to about 23 nm. In another embodiment, a bundle of carbon nanotubes being dispersed in a solvent of sodium dodecyl benzene sulphonate (SDBS) may have a reduced bundle diameter ranging from about 7 nm to about 25 nm. FIG. 5 depicts the effect of dispersion and bundle size on the resistance and transmittance of carbon single wall nanotubes. It is noted that larger bundle sizes have a higher resistance than smaller bundle sizes, wherein the transmittance is not as significantly affected.

In another embodiment, the doped nanotubes may enable a long range order in the polymer for more efficient charge transport. In one embodiment, the nanotube network enable a long range order in the polymer ranging from about 1.0 nm to about 1.0 micron in the width direction (x-direction) and ranging from about 1.0 nm to about 100 microns in the length direction (y-direction). In a further embodiment, in which the production of the single wall nanotubes (SWNTs) results in bundles of nanotubes that are of different chiralities with different band gaps, reducing the relative band gaps between nanotubes through the use of dopant molecules can lead to reduced resistance in the nanotube network.

In one embodiment, the nanotubes may be doped during production; purification processing, and/or post-processing. In one embodiment, the nanotubes may be doped during synthesis or by post processing through the use of gases, liquids, or solids, such as polymers, such as the polymers used in the polymer matrix. For example, post-growth doping nanotubes may be accomplished via deposition of dopant from vapor, liquid of solid phase in controlled atmosphere, vacuum or air. In one embodiment, deposition of dopants from vapor includes vapor gas absorption onto the carbon nanotubes. In one embodiment, deposition of dopants from liquid includes liquid dipping followed by a post treatment that may include heating and/or cooling.

Figure 6A:
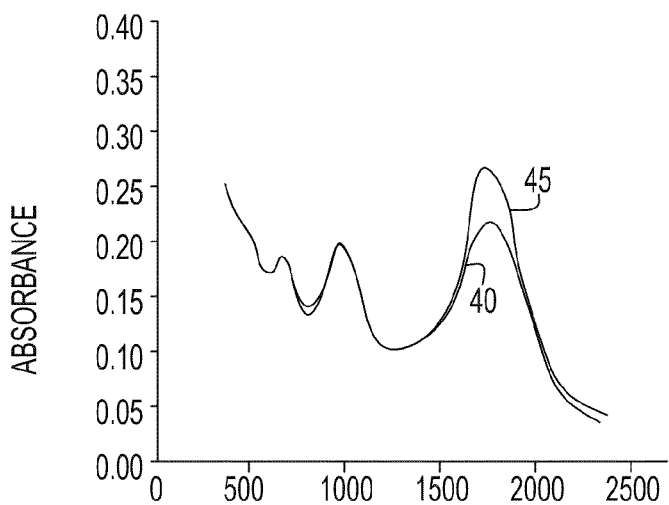
FIGS. 6A-6B, are plots depicting the effect of nitride acid dopant on the absorbance of carbon nanotubes, in accordance with one embodiment of the present invention.
Figure 6B:
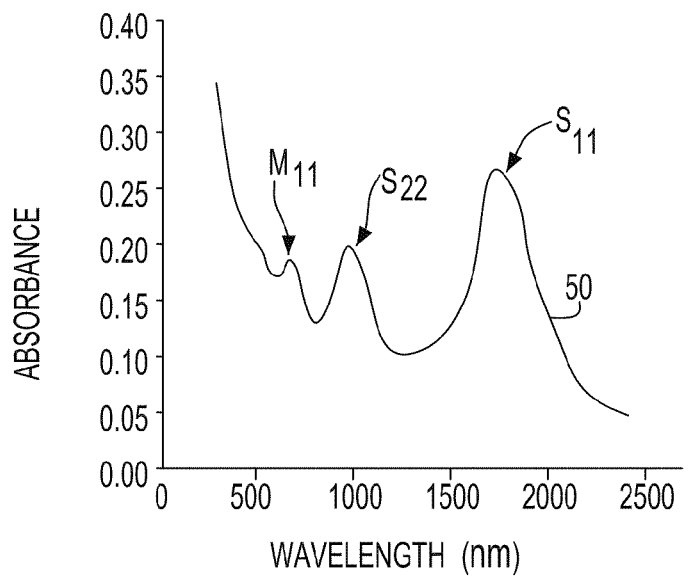
Figure 6C:
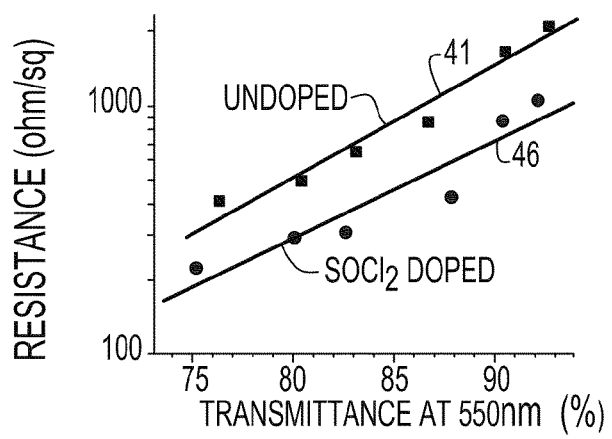
FIGS. 6C-6D, are plots depicting the effect of thioynl acid dopant on the resistance and absorbance of carbon nanotubes, in accordance with one embodiment of the present invention.
Figure 6D:
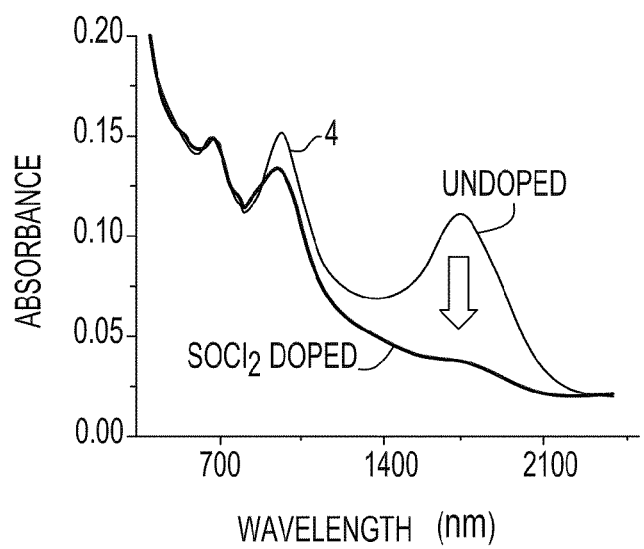

Examples of dopants may include nitric acid, thionyl chloride ($SOCl_2$), triethylamine (Et3N), pyridine ($C_6H_5N$), orthodichlorobenzene or combinations thereof. For example, the effects of nitric acid as a doping agent are shown in FIGS. 6A-6B, in which undoped data is indicated by reference line 40 in FIG. 6B and the reference line 45 in FIG. 6A, while doped data is represented by reference line 50 in FIG. 6A. In one embodiment, the introduction of the dopant reduces the adsorption of the carbon nanotubes. For example, in one embodiment, doping with nitric acid may reduce the absorbance from approximately 0.25 to approximately 0.22 at wavelengths on the order of 1700 nm. In one embodiment, monitoring of optical transitions of single wall carbon nanotube using optical absorption spectroscopy allows the effects of doping (reference line 50) on the $S_{11}$, $S_{22}$, and $M_{11}$, bands to be assessed during synthesis and processing of nanotubes. In another example, the effects of thionyl chloride ($SOCl_2$) as a doping agent are shown in FIGS. 6C-6D, in which undoped data is indicated by reference line 41 and doped data is represented by reference line 46. Referring to FIG. 6C, thionyl chloride ($SOCl_2$) doped carbon nanotubes displayed a lower resistance than non-doped carbon nanotubes at similar transmittance in film thicknesses on the order of 550 nm, wherein the resistance decreased by about a factor of 2 upon doping. Referring to FIG. 6D, doping with thionyl chloride ($SOCl_2$) may reduce the absorbance from approximately 0.12 to approximately 0.05 at wavelengths on the order of 1500 nm.

In another embodiment, electrochemical doping of carbon nanotubes can be achieved through nanotube assembly at negative potentials (vs reference electrode) for hole-doping. Electrochemical doping is a controlled oxidation of the carbon nanotubes. More negative electrode potentials result in deeper levels of doping. Positive potentials (vs reference electrode) are used for electron-doping, with more positive electrode potentials used for deeper levels of doping. The electrochemical doping is maintained by retrieving the working electrode from the electrolyte, such as diluted sulfuric acid, while maintaining the doping potential. Mixtures of these two types of electrochemically doped nanotubes may be used to construct interpenetrating networks of n- and p-doped nanotubes within the polymer to provide pathways for charge carriers, such as electrons or holes. In addition to doping to control the orientation of nanotubes within the polymer matrix, solvent treatments are provided to straighten the nanotubes and their networks separate from or within the polymer matrix to provide longer effective lengths for each nanotube to provide better percolation at lower weight loading.

In one embodiment, methods for orienting nanotubes for substantially transparent composites include, but are not limited to: dielectrophoresis, electrospun nanotube-polymer fibers, spray deposition of solublized nanotubes onto surfaces, controllable aggregation (drying), and extrusion of high-density nanotube fibers.

Figure 7:
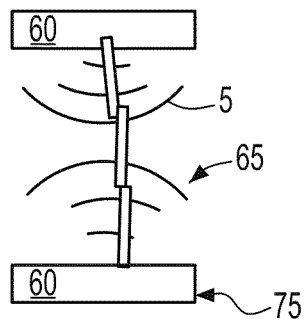
FIG. 7 is a side cross sectional view depicting one embodiment of organic electrical device, in accordance with the present invention.

Referring to FIG. 7, in one embodiment, dielectrophoretic alignment of the carbon nanotubes 5 into networks is provided in the the polymer matrix 20 during the drying process. In one embodiment, dielectrophoretic alignment includes aligning carbon nanotubes 5 co-solublized in a solvent, such as ortho-dichloro benzene (ODCB) or chloroform ($CHCl_3$), by positioning the carbon nanotubes 5 between two electrodes 60 that are positioned opposing and parallel to one another, and then applying an oscillating electrical field 65 between the electrodes 60. In one embodiment foaming an oscillating electric field 65 includes alignment of the carbon nanotubes 5 to the electrodes 60 using DC and/or AC electric fields during the drying process, and alternating the current in the kHz and MHz range. In one embodiment, the current is alternated in a range of approximately 1 KHz to approximately 1 MHz. In one embodiment, alignment of the carbon nanotubes 5 includes positioning the length L1 of the carbon nanotubes 5 substantially perpendicular to the parallel surfaces of the opposing electrodes 60. In one embodiment, alignment of the carbon nanotubes 5 includes positioning the length of the carbon nanotubes 5 substantially perpendicular to the parallel surface of the electrodes 60, wherein adjacent carbon nanotubes 5 are positioned in electrical communication from the first of the opposing electrodes to the proximity of the second of the opposing electrodes.

In one embodiment, the carbon nanotubes are aligned into networks using vacuum filtration of nanotube solutions to provide a transparent membrane. In one embodiment, thin transparent membranes of carbon nanotubes may be formed by co-solubilization or suspension of carbon nanotubes in a solvent, such as ODCB, and/or surfactant solution, such as SDS. In one embodiment, the carbon nanotubes are dispersed in the solution, and then vacuum filtered through a membrane. In one embodiment, the carbon nanotube dispersion is vacuum filtered at approximately—1 atm. In one embodiment, the membrane includes a pore size ranging from about 100 nm to about 2000 nm. In one embodiment, the membrane includes a pore size on the order of about 20 nm. In one embodiment, the membrane is composed of a dissolvable material, such as cellulose nitrate. In one embodiment, following filtering of the nanotubes onto the membrane, the carbon nanotubes are transferred by a floating method to a substrate or wire mesh. In one embodiment, during or following transferal of the carbon nanotubes the membrane may be dissolved. In one example, a membrane composed of cellulose nitrate may be dissolved by acetone. It is noted that other materials besides cellulose nitrate have been contemplated for use as the dissolvable membrane, and are within the scope of the present invention.

In another embodiment, before the membrane is dissolved the membrane including the captured nanotubes may be engaged to a substrate, such as a glass substrate. Following engagement of the membrane to the substrate, the membrane may then be dissolved and the nanotubes transferred to the substrate. In one embodiment, vacuum filtration is used in combination with dielectrophoretic alignment, hence providing an aligned network of carbon nanotubes.

In one embodiment, a method for orientating nanotube for transparent composites includes dispersion of carbon nanotubes by sonication in a solvent or surfactant, vacuum filtering to provide a carbon nanotube film, washing the carbon nanotube film, washing the carbon nanotube film with DI water, transferring the carbon nanotube film to a glass substrate, and dissolving the membrane. Sonication is act of applying sound (usually ultrasound) energy to agitate particles in a samples. In one embodiment, sonication is applied using an ultrasonic bath of an ultrasonic probe. In one embodiment, sonication is increases transmittance by dispersing the bundled nanotube aggregated. In one embodiment, sonication reduces the aspect ration of the nanotube bundles.

Figure 8A:
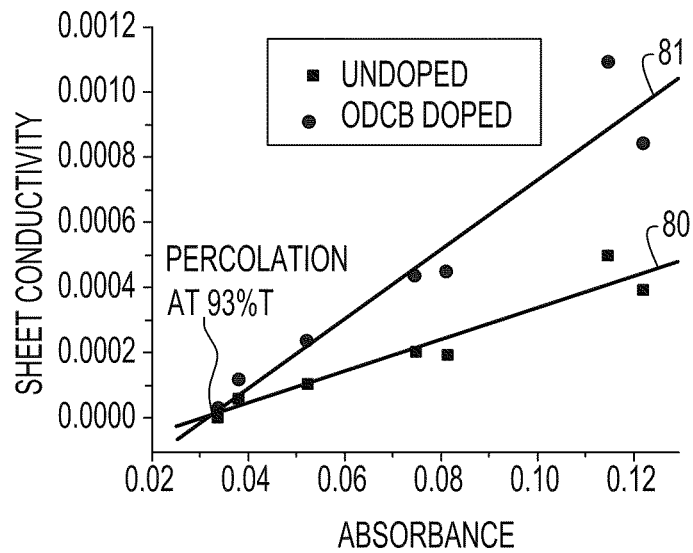
FIGS. 8A-8B depict the effect of ortho-dichloro benzene (ODCB) dopant on the sheet conductivity of one embodiment of an organic electrical device, in accordance with the present invention.
Figure 8B:
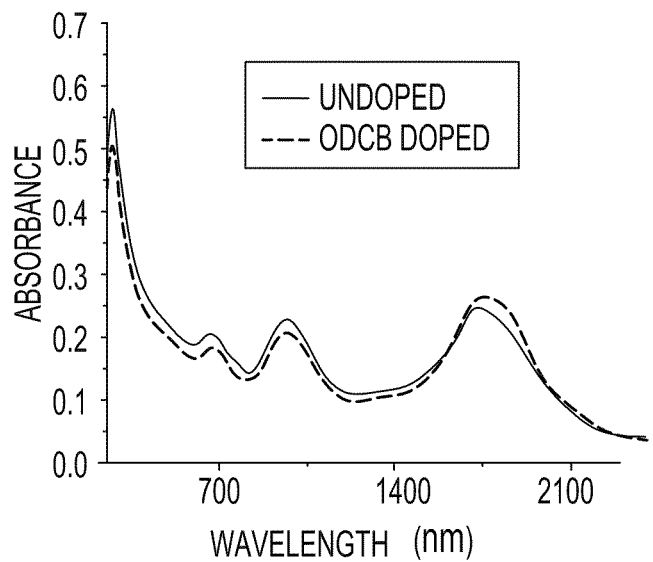

In one embodiment, the present invention provides a method to lower the inter-nanotube junction resistance to increase the conductivity of the carbon nanotube network. In one embodiment, the inter-nanotube resistance may be lowered by the addition of charge transfer elements or compounds. In one embodiment, the resistance of nanotube-to-nanotube junctions may be reduced by doping them with dopants, such as $HNO_3$ or $SOCl_2$ or ortho-dichioro benzene. FIG. 8A depicts a plot 80 of absorbance v. sheet conductivity of a carbon nanotube doped with OCDB, in comparison to a non-doped carbon nanotube 81. FIG. 8B depicts a plot 82 of wavelength v. absorbance of a carbon nanotube doped with OCDB, in comparison to a non-doped carbon nanotube 83.

In another embodiment, the carbon nanotubes may be washed to clean them in an effort to reduce inter-nanotube resistance. In one embodiment, the carbon nanotubes may be washed with solvents or peroxides to suspend or solubilize internanotube impurities, such as amorphous carbon. In an even further embodiment, a compressive force may be applied to the carbon nanotube mat to enhance inter-nanotube connectivity.

Referring to FIG. 9, in another aspect of the present invention, an organic electrical device is provided that includes a polymer composite including a first plurality of carbon nanostructures 5 positioned in a polymer matrix 20; and a positive electrode 70 and a negative electrode on 75 opposing sides of the polymer composite, wherein at least one of the positive electrode and the negative electrode includes a carbon nanotube mat 6 composed of a second plurality of carbon nanostructures, the second plurality of carbon nanostructures including a dopant to provide the at least one of the positive electrode and the negative electrode with a work function substantially equal to a work function of the polymer matrix 20. In one embodiment, carbon nanotube mats 6 enhance charge injection into the polymer matrix 20, permitting both electrons and holes to be injected, hence lowering the turn on voltage of the device and increasing the brightness of the device.

In one embodiment, a transparent carbon nanotube mat 6 is provided as a conformable electrode for the organic electric device of the present invention, such as an organic light emitting diode. In one embodiment, in order to maintain transparency the thickness of carbon nanotube mat 6 is provided at less than 100 nm. In another embodiment, the thickness of carbon nanotube mat 6 ranges from about 10 nm to about 20 nm. In one embodiment, both of the electrodes of the organic electrical device are composed of transparent carbon nanotube mats. In another embodiment, the electrode positioned on the portion of the organic electric device, i.e., organic light emitting diode, that emits light, wherein the opposing electrode includes a reflective surface that may serve as a mirror to direct light. In one embodiment, the carbon nanotubes that provide the electrodes of the device may penetrate into the polymer matrix and provide the network of carbon nanotubes that provides electrical communication between the electrodes through the polymer matrix.

Applications for organic electrical devices including polymer composites composed of nanotube arrays include, but are not limited to: chemical sensors, light sensors, photochemical sensors, and redox sensors. It is noted that the above applications are for illustrate purposes only and not intended to limit the invention thereto, as further applications have been contemplated and are within the scope of the present invention.

In addition to the above-described manufacture of carbon nanotubes that provides a random array of nanotubes, other manufacturing methods for providing carbon nanotubes have been provided and are within the scope of the present invention. In one embodiment, the carbon nanotubes are positioned in a vertically aligned array. In one embodiment, the vertically-aligned nanotube arrays (VANTAs) can be synthesized by thermal chemical vapor deposition of hydrocarbon feedstocks onto substrates that are patterned with metal catalyst films. Broadly, in one embodiment, thermal chemical vapor deposition synthesis is achieved by providing a carbon source in a gas phase and using an energy source, such as a plasma or resistively heated coil, to transfer energy to a gaseous carbon molecule. Examples of chemical vapor deposition processes suitable for forming carbon nanotubes include, but are not limited to: plasma enhanced chemical vapor deposition (PECVD), thermal chemical chemical vapor deposition (CVD), vapor phase growth, aero gel supported chemical vapor (CVD) and laser assisted chemical vapor deposition In one embodiment, the patterned metal catalyst films are composed of a single layer or multilayers of thin metal films that are deposited by electron beam evaporation, sputtering, or chemical vapor deposition. In one embodiment, the metal catalyst film may include a transition metal including but not limited to Ni, Fe, or Co. In one embodiment, following deposition the metal catalyst film is patterned using photolithography and etch processes. The metal catalyst film may be patterned to provide dots patterns, pillars, stripes, and/or functional structures, such as sensor structures.

In one embodiment, the patterned metal catalyst film includes a buffer layer, e.g., Al, which is in contact with the substrate, and a metal catalyst, e.g., 0.2-1.0 nm of Fe formed atop the buffer layer. In one embodiment, the patterned metal catalyst film includes another metal layer, such as 0.2 nm of Mo.

In a following process step, the substrate including the pattered metal catalyst film is placed inside a tube furnace and the temperature is raised under hydrogen and argon gas flow at various partial pressures. In one embodiment, hydrocarbon feedstocks that may include other gases, such as acetylene with hydrogen and argon, or ethanol with hydrogen and argon, or methanol with hydrogen and argon, are passed over the patterned metal catalyst in a thermal chemical vapor deposition process, wherein carbon nanotubes grow from the patterned metal catalyst film. Following chemical vapor deposition, the method of forming vertically-aligned carbon nanotubes may further include infiltration of the arrays with a polymer solution, followed by exfoliation of the film containing the VANTA by dissolution, peeling, and then physical exfoliation. In one embodiment, the carbon nanotubes produced in forming the VANTAs may or may not be single wall carbon nanotubes (SWNT).

In one embodiment, the VANTAs may be infiltrated with polymer to maintain their alignment. In one embodiment when the organic electrical device is composed of VANTAs through the polymer matrix, the primary electrical conductivity path or thermal conductivity path through the polymer matrix is arranged perpendicular to the plane of the surface onto which the carbon nanotubes are grown. Contrary to a network of carbon nanotubes, in which adjacent nanotubes are in electrical communication to provide a conductive path through the polymer matrix, adjacent VANTAs are parallel to one another, wherein the length of the conductive pathway corresponds to the height on nanotube that is grown from a base substrate.

In one embodiment of the present invention, VANTAs may be grown up to several millimeters in height or grown with limited heights of only one hundred nanometers with an accuracy of about 20 nm. In one embodiment, control over the height of the VANTAs permits the color of the grown film to be controlled on the basis of interference fringes which result from light reflecting from the top and back surfaces of the array. In a further embodiment, the controllable height of the VANTAs provides for polarization control of the transmitted radiation.

In one embodiment, the patterning of the metal catalyst on which the VANTAs are grown dictates the geometry of electrically conductive pathways, while tailoring the optical transparency of the overall film. In another embodiment, the VANTAs are etched using photolithography and etch process, such as reactive ion etch, to provide electrically conductive pathways.

In one embodiment, the VANTAs display a directional optical absorbance. In one example, a polymer composite including VANTAs may function as a blinder that allows transmission of light along a specified direction, wherein off axis light would be greatly attenuated. In one embodiment, adjusting the height of the VANTAs dictate the optical properties, such as transmitted optical properties, of the polymer composite. In another embodiment, interference patterns and color effects can be manipulating the VANTAs into photonic band gap structures. In one embodiment, the VANTAs are manipulated into photonic band gap structures using photolithography and etch processes.

Applications for organic electrical devices including polymer composites composed of VANTAs include optical elements, such as optical filters, polarizers, and gratings, as well as embedded stress prognostic sensors. It is noted that the above applications are for illustrate purposes only and not intended to limit the invention thereto, as further applications have been contemplated and are within the scope of the present invention.

The following examples are provided to further illustrate aspects of the present invention and demonstrate some advantages that arise therefrom. It is not intended that the invention be limited to the specific examples disclosed.

EXAMPLES

Single wall nanotubes were synthesized by laser vaporization and purified by dilute $HNO_3$ reflux/air oxidation procedure. A conjugated polymer poly(2-methoxy-5-(2'-ethylhexyloxy)-1, 4-phenylenevinylene) (MJEHPPV) was provided having a molecular weight of 51,000 and a polydispersity of 1.1. To obtain uniform dispersion of the SWNTs in the MEHPPV, two solvents: ortho-dichlorobenzene (ODCB) and chloroform ($CHCl_3$) were used first to suspend the SWNTs and dissolve the MEHPPV, respectively, under ultrasonication.

In a following process step, the SWNT and MEHPPV solutions were mixed to formulate the SWNT/MEHPPV composite solutions at designed doping concentrations. 80 nm thick light-emitting films were spin cast from the composite solutions on indium-tin oxide (ITO) substrates with the resistance of 10 ohm/square. Single-layer LEDs of SWNT/MEHPPV composites were fabricated with an architecture of ITO/composite/Al by thermally evaporating aluminum (Al) electrode on the spin-cast thin films under the vacuum of $2\times10^{-6}$ Torr.

The thicknesses of spin-cast thin films were measured by a Dektak IIA surface profilometer. The EL, PV, and PL characteristics were measured with a Keithley 2400 sourcemeter, integrating sphere, and Fluorolog 3-22 spectrometer in nitrogen atmosphere.

It can be seen in FIG. 10A that the presence of SWNTs increases the MEHPPV EL intensity, and reduces threshold voltage from 8V for the pure MEHPPV to 2V for the polymer composite containing 0.1 wt % SWNTs at forward bias. The 0.1 wt % SWNTs result in a significant charge injection and thus EL from MEHPPV at reverse bias (see FIG. 10B), yielding an alternating EL output.

The similar EL spectra between the SWNT (0.1 wt %)/MEHPPV composite and the pristine MEHPPV (see FIG. 10C) confirm that the light emission comes from the MEHPPV component in the composite LEDs at forward or reverse bias. Therefore, it is clear that the dispersed SWNTs improve the charge injection and subsequently enhance the EL in the SWNT/MEHPPV composite LEDs at both forward and reverse biases.

We now consider why the dispersed SWNTs can boost both charge injection and EL in the SWNT/MEHPPV composites. The band diagram (see FIG. 10D) indicates that the electrons and holes can be easily injected into the SWNTs due to the absence of substantial potential barriers at the ITO/SWNT and SWNT/Al contacts in the SWNT/MEHPPV composite LEDs at forward bias. At reverse bias, although small potential barriers exist at the ITO/SWNT and SWNT/Al contacts, electrons and holes can still be more significantly injected into the SWNTs as compared with the MEHPPV component of the SWNT/MEHPPV composites.

Under the influence of an applied electric field, the injected electrons and holes in the SWNTs can be further transferred into the LUMO (lowest unoccupied molecular orbital) and HOMO (highest occupied molecular orbital) of the MEHPPV component at the SWNT-polymer interface due to the large surface-contact areas of SWNTs and field-enhanced effect at nanotube tips. Therefore, the dispersed SWNTs can improve the electron and hole injection into conjugated polymers through the tube-chain interfaces at both forward and reverse biases, leading to an enhanced reverse and forward organic EL, as observed in FIG. 11A and FIG. 11B.

Figure 11A:
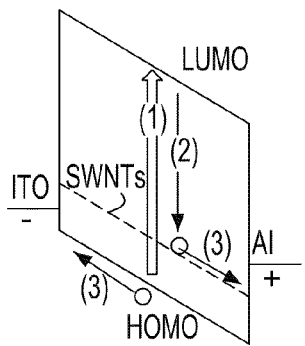
FIGS. 11A and 11B depict a plot of one embodiment of an organic electrical device that operates in reverse and forward bias, in accordance with the present invention.
Figure 11B:
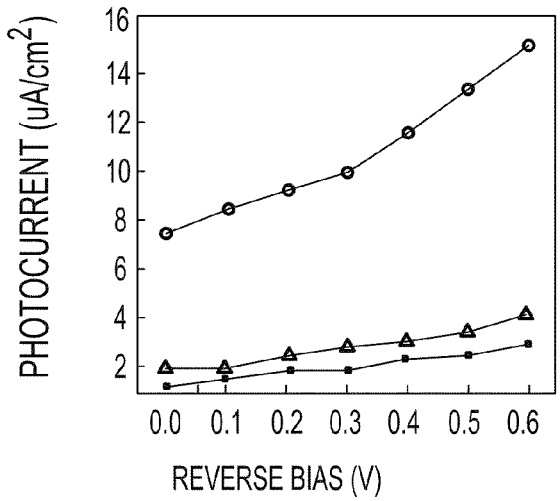

It is noted that the band offset at the SWNT polymer interface usually causes the exciton dissociation and thus increases the PV response, as shown in FIG. 11A. To study this SWNT-induced exciton dissociation, we measured the photocurrent of the single-layer SWNT/MEHPPV composite LEDs under the illumination of 0.2 mW/cm$^2$ at 450 mn. It can be seen in FIG. 11B that the photocurrent from the SWNT/MEHPPV LEDs continuously increases upon the SWNT doping.

For instance, the 0.1 wt % of SWNTs increases the photocurrent by a factor of 6 at the reverse bias of 0.6 V. Therefore, it can be concluded that the SWNTs at low doping concentration ($\leq$0.1 wt %) enhance both EL and PV response in the SWNT/MEHPPV composite LEDs. We note that the EL light emission and PV response are usually competing in an optoelectronic device. To further understand the competition between the SWNTs enhanced EL and PV, we measured both EL efficiency and photocurrent as a function of SWNT doping concentration based on the single-layer SWNT/MEHPPV composite LEDs.

Figure 12:
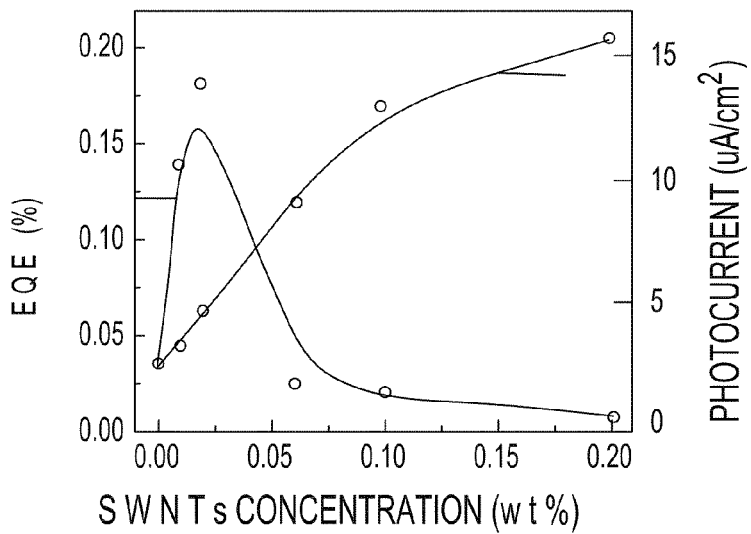
FIG. 12 depicts a plot of the external quantum EL efficiency for one embodiment of an organic electrical device, in accordance with the present invention.

FIG. 12 shows that the external quantum EL efficiency increases from 0.04% photon/electron with the SWNT doping at low concentrations and rapidly reaches a maximum of about 0.25% photon/electron when the SWNTs concentration was increased to about 0.02 wt %. Further increase of the SWNTs concentration results in a decrease of the EL efficiency. However, the photocurrent shows a continuous increase with the SWNT doping from low to relatively high concentrations up to 0.2 wt %. Therefore, it can be concluded that the dispersed SWNTs at low concentrations mainly improve the bipolar charge injection through the SWNT-polymer interface and thus enhance the polymer EL at both forward and reverse biases.

When the SWNTs concentration further increases (>0.02 wt %), the EL efficiency is largely decreased and the enhancement of the PV response becomes dominant in the SWNT/MEHPPV composite. In summary, this SWNT concentration-dependent EL and PV actions indicate that adjusting the dispersion of the SWNTs in conjugated polymer materials can lead to an individual control of dual EL and PV functions in carbon nanotube doped conjugated polymer optoelectronic devices.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of forming an organic electric device comprising:
providing a plurality of conductive nanostructures; and
dispersing the plurality of conductive nanostructures in a polymeric matrix to provide a polymeric composite, wherein the plurality of conductive nanostructures are present in the polymeric matrix at a concentration below a percolation threshold for the conductive nanostructures, wherein the organic electric device is characterized by an electroluminescent response.

2. The method of claim 1, wherein the first concentration of the plurality of conductive nanostructures provides an organic light emitting diode.

3. The method of claim 1, wherein the step of dispersing the plurality of carbon nanostructure in polymeric matrix comprises a solvent, wherein the solvent comprises ortho-dichloro benzene (ODCB), chloroform ($CHCl_3$), sodium dodecyl sulfate (SDS), sodium cholate (SC), sodium dodecyl benzene sulphonate (SDBS), t-octyl phenoxy polyethoxyethanol, or combinations thereof.

4. The method of claim 3, wherein the step of dispersing the plurality of carbon nanostructures in the polymeric matrix comprises adding charge transfer elements and dopant materials to the solvent, wherein the charge transfer elements and the dopant materials reduce a resistance at a junction of the carbon nanostructures and the polymeric matrix.

5. The method of claim 1, wherein the conductive nanostructures are provided by laser vaporization, treated with an acid treatment, and oxidized to high purity.

6. The method of claim 5, wherein the conductive nanostructures are single wall carbon nanotubes.

7. The method of claim 1, wherein the conductive nanostructures are doped to provide a single wall carbon nanotube having a work function positioned between a highest occupied molecular orbital and a lowest occupied molecular orbital of the polymer matrix.

8. The method of claim 1, wherein the step of dispersing the plurality of conductive nanostructures in a polymeric matrix comprises at least one of dielectrophoretic alignment, vacuum filtration, electrospun nanotube-polymer fibers, spray deposition of solublized nanotubes, or a combination thereof.

* * * * *